US009269561B2

(12) United States Patent
Dang et al.

(10) Patent No.: US 9,269,561 B2
(45) Date of Patent: Feb. 23, 2016

(54) WAFER DEBONDING USING LONG-WAVELENGTH INFRARED RADIATION ABLATION

(71) Applicant: GLOBALFOUNDRIES INC., Grand Cayman (KY)

(72) Inventors: Bing Dang, Chappaqua, NY (US); John U. Knickerbocker, Monroe, NY (US); Cornelia Kang-I Tsang, Mohegan Lake, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 13/746,359

(22) Filed: Jan. 22, 2013

(65) Prior Publication Data

US 2014/0147986 A1    May 29, 2014

Related U.S. Application Data

(63) Continuation of application No. 13/687,531, filed on Nov. 28, 2012, now abandoned.

(51) Int. Cl.
*H01L 21/20* (2006.01)
*H01L 21/683* (2006.01)
(Continued)

(52) U.S. Cl.
CPC .... *H01L 21/02002* (2013.01); *H01L 21/67092* (2013.01); *H01L 21/6835* (2013.01);
(Continued)

(58) Field of Classification Search
CPC ............... H01L 21/76254; H01L 21/76262; H01L 2221/68318; H01L 2221/68322; H01L 2221/68386; H01L 21/02002; H01L 21/67092; H01L 21/6835; H01L 21/302; H01L 51/003; H01L 21/76251; H01L 21/2007
USPC ......... 438/458, 118, 406, 455, 160, 463, 624; 257/E21.122, E21.568, E21.57; 136/237; 250/492.2; 428/448, 702, 428/447; 156/701
See application file for complete search history.

(56) References Cited

U.S. PATENT DOCUMENTS 5,871,884 A * 2/1999 Ellis ............................. 430/201
6,284,425 B1 * 9/2001 Staral et al. .................. 430/201
(Continued)

FOREIGN PATENT DOCUMENTS

CN    102077326 A    5/2011
EP       0131375 A1    1/1985
(Continued)

OTHER PUBLICATIONS

B. Dang et al., "CMOS Compatible Thin Wafer Processing Using Temporary Mechanical Wafer, Adhesive and Laser Release of Thin Chips/Wafers for 3D Integration," IEEE 60th Electronic Components and Technology Conference (ECTC), Jun. 2010, pp. 1393-1398.

*Primary Examiner* — Jarrett Stark
*Assistant Examiner* — Bitew Dinke
(74) *Attorney, Agent, or Firm* — Scully Scott Murphy and Presser; Frank Digiglio

(57) ABSTRACT

Methods are provided for handling a device wafer. For example, a method includes providing a stack structure having a device wafer, a handler wafer, and a bonding structure disposed between the device wafer and handler wafer, and irradiating the bonding structure with long-wavelength infrared energy to ablate the bonding structure.

11 Claims, 7 Drawing Sheets

(51) Int. Cl.
*H01L 21/02* (2006.01)
*H01L 21/67* (2006.01)
*B82Y 30/00* (2011.01)

(52) U.S. Cl.
CPC ........ *B82Y 30/00* (2013.01); *H01L 2221/6834* (2013.01); *H01L 2221/68318* (2013.01); *H01L 2221/68327* (2013.01); *H01L 2221/68381* (2013.01); *Y10S 977/902* (2013.01); *Y10T 156/1158* (2015.01); *Y10T 156/1917* (2015.01); *Y10T 428/24355* (2015.01); *Y10T 428/265* (2015.01); *Y10T 428/31678* (2015.04)

(56) References Cited

U.S. PATENT DOCUMENTS

| | | | | |
|---|---|---|---|---|
| RE40,601 E | * | 12/2008 | Inoue et al. | 257/59 |
| 8,003,483 B2 | * | 8/2011 | Suzawa et al. | 438/406 |
| 8,181,688 B2 | | 5/2012 | Johnson et al. | |
| 8,241,536 B2 | | 8/2012 | Jiang et al. | |
| 2004/0087110 A1 | * | 5/2004 | Takayama et al. | 438/458 |
| 2005/0233547 A1 | * | 10/2005 | Noda et al. | 438/459 |
| 2005/0282357 A1 | * | 12/2005 | Takayama et al. | 438/458 |
| 2006/0131703 A1 | * | 6/2006 | Majumdar et al. | 257/665 |
| 2006/0270189 A1 | * | 11/2006 | Ogita et al. | 438/455 |
| 2007/0010067 A1 | * | 1/2007 | Shimoda et al. | 438/455 |
| 2007/0099413 A1 | | 5/2007 | Shiu et al. | |
| 2008/0124839 A1 | | 5/2008 | Saiki et al. | |
| 2008/0176046 A1 | * | 7/2008 | Yamaguchi et al. | 428/195.1 |
| 2008/0268618 A1 | * | 10/2008 | Yamazaki | 438/458 |
| 2009/0001378 A1 | * | 1/2009 | Miyake | 257/71 |
| 2009/0029152 A1 | * | 1/2009 | Yun et al. | 428/328 |
| 2009/0117707 A1 | * | 5/2009 | Shimomura et al. | 438/458 |
| 2009/0239354 A1 | * | 9/2009 | Suzawa et al. | 438/458 |
| 2009/0275196 A1 | * | 11/2009 | Yamazaki et al. | 438/652 |
| 2010/0041211 A1 | * | 2/2010 | Noda et al. | 438/464 |
| 2010/0171138 A1 | * | 7/2010 | Yamazaki et al. | 257/98 |
| 2010/0263794 A1 | | 10/2010 | George et al. | |
| 2010/0330788 A1 | | 12/2010 | Yu et al. | |
| 2011/0010908 A1 | | 1/2011 | George et al. | |
| 2011/0073847 A1 | * | 3/2011 | Kobayashi et al. | 257/40 |
| 2011/0300356 A1 | | 12/2011 | Takamatsu et al. | |
| 2012/0034437 A1 | | 2/2012 | Puligadda et al. | |
| 2012/0080150 A1 | | 4/2012 | Riege et al. | |
| 2012/0118511 A1 | * | 5/2012 | Imai et al. | 156/712 |
| 2012/0219609 A1 | * | 8/2012 | Howland | 424/404 |
| 2012/0268817 A1 | * | 10/2012 | Kozlov | 359/485.05 |
| 2014/0077199 A1 | * | 3/2014 | Yamazaki et al. | 257/40 |
| 2015/0035173 A1 | * | 2/2015 | Dang et al. | 257/783 |
| 2015/0035554 A1 | * | 2/2015 | Dang et al. | 324/756.01 |

FOREIGN PATENT DOCUMENTS

| | | |
|---|---|---|
| KR | 20110103193 A | 9/2011 |
| WO | 2011100030 A1 | 8/2011 |

* cited by examiner

WAFER DEBONDING USING LONG-WAVELENGTH INFRARED RADIATION ABLATION

CROSS-REFERENCE TO RELATED APPLICATION

This application is a Continuation of U.S. patent application Ser. No. 13/687,531, filed on Nov. 28, 2012, the disclosure of which is fully incorporated herein by reference

TECHNICAL FIELD

The field generally relates to wafer handling techniques and, in particular, to structures and methods for temporarily bonding handler wafers to device wafers using bonding structures that include one or more releasable layers that absorb infrared radiation to achieve wafer debonding by infrared radiation ablation.

BACKGROUND

In the field of semiconductor wafer processing, increasing demands for large-scale integration, high density silicon packages has resulted in making semiconductor dies very thin. For example, for some applications, silicon (Si) wafers are backside grinded and polished down to a thickness of 50 μm or thinner. Although single crystal Si has very high mechanical strength, Si wafers and/or chips can become fragile as they are thinned. Defects can also be introduced by processing steps such as through-silicon via (TSV) processing, polishing, and dicing, which further reduces the mechanical strength of a thinned wafer or chip. Therefore, handling thinned Si wafers presents a significant challenge to most automation equipment.

In order to facilitate the processing of a device wafer, a mechanical handler wafer (or carrier wafer) is usually attached to the device wafer to enhance the mechanical integrity of the device wafer during processing. When processing of the device wafer is complete, the handler wafer needs to be released from the device wafer. The most common approach to handling a device wafer is to laminate the handler wafer with the device wafer using specially developed adhesives. Depending on factors such as the processing steps, the product requirements, and the type of the adhesive, various techniques have been used or proposed to debond or separate a thinned device wafer from a mechanical handler wafer, including thermal release, chemical dissolving, and laser ablation techniques.

A typical laser-assisted debonding process uses a polymeric adhesive (which is capable of sufficient absorption of energy in the UV (ultra violet) spectrum) to bond a device wafer to a UV transparent glass handler wafer. A laser ablation process is performed to ablate the polymeric adhesive and achieve debonding between the glass handler wafer and the device wafer. The use of a glass handler in the UV laser ablation process has several drawback including poor thermal conductivity, incompatibility with certain semiconductor processing equipment, as well as high cost. Although the use of Si wafer handlers can potentially overcome these drawbacks, silicon is not transparent to UV spectrum and therefore is not compatible with previously developed UV laser release technology.

SUMMARY

In general, embodiments of the invention include structures and methods for temporarily bonding handler wafers to device wafers using bonding structures which include one or more releasable layers that absorb infrared radiation to achieve wafer debonding by infrared radiation ablation.

In one embodiment of the invention, a stack structure includes a device wafer, a handler wafer, and a bonding structure disposed between the device wafer and the handler wafer to bond the device and handler wafers together. The bonding structure includes an adhesive layer, and a metallic layer. The metallic layer serves as a releasable layer of the bonding structure by infrared ablation of the metallic layer.

In another embodiment of the invention, a stack structure includes a device wafer, a handler wafer, and a bonding structure disposed between the device wafer and the handler wafer to bond the device and handler wafers together. The bonding structure comprises an adhesive layer having infrared energy absorbing nanoparticles. The adhesive layer serves as a releasable layer by infrared ablation of the adhesive layer.

In another embodiment of the invention, a method is provided for handling a device wafer. The method includes providing a stack structure having a device wafer, a handler wafer, and a bonding structure disposed between the device wafer and handler wafer, and irradiating the bonding structure with long-wavelength infrared energy to ablate the bonding structure.

These and other embodiments of the invention will be described or become apparent from the following detailed description of embodiments, which is to be read in conjunction with the accompanying drawings.

DETAILED DESCRIPTION

Figure 1:
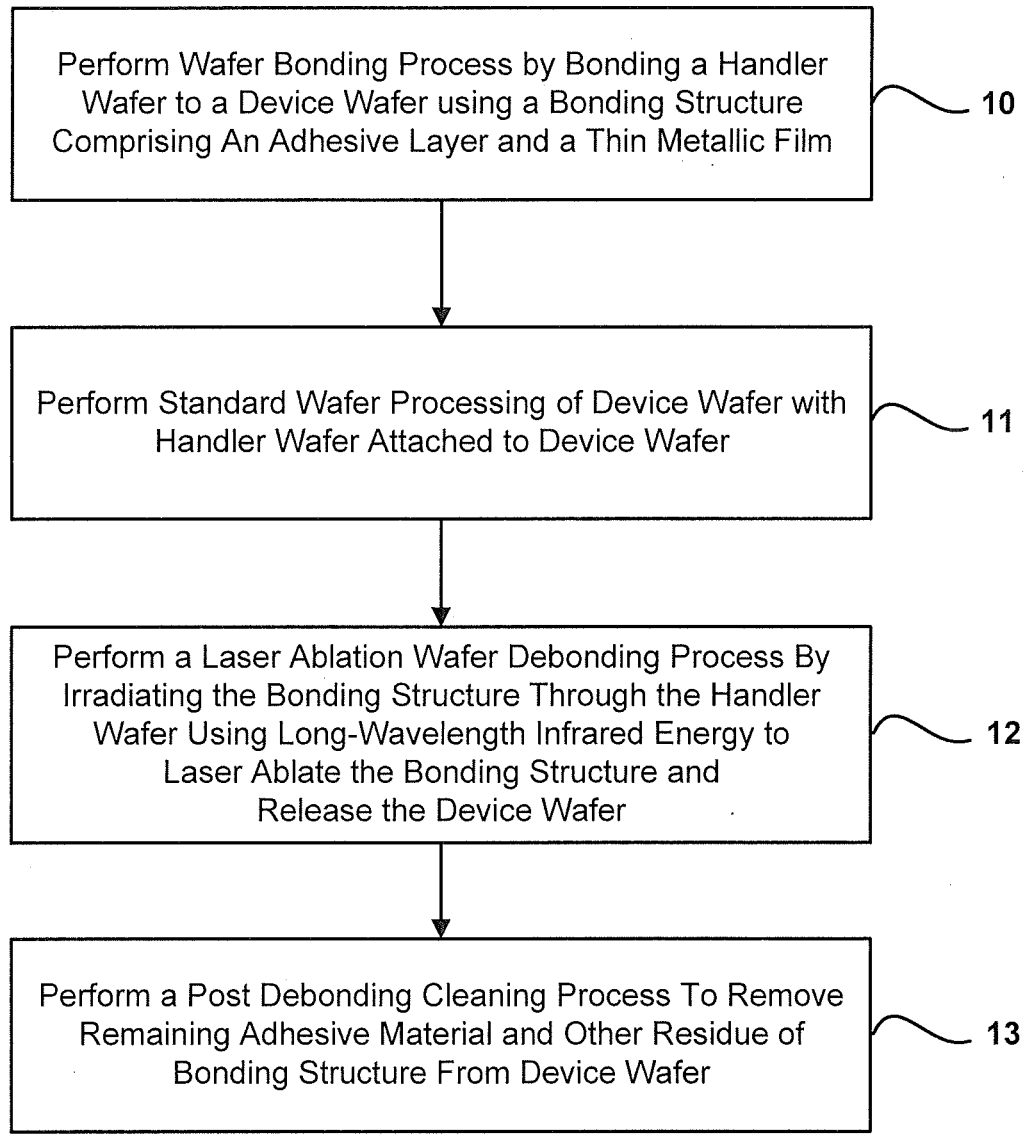
FIG. 1 is flow diagram of a method for processing and handling a semiconductor wafer according to an embodiment of the invention.

Embodiments of the invention will now be discussed in further detail with regard to structures and methods for temporarily bonding silicon handler wafers to device wafers using bonding structures that include one or more releasable layers that absorb infrared radiation to achieve wafer debonding by infrared radiation ablation. For example, FIG. 1 is flow diagram that illustrates a method for processing and handling a semiconductor wafer according to an embodiment of the invention. Referring to FIG. 1, the method includes performing a wafer bonding process by bonding a handler wafer (or handler substrate) to a device wafer (or chip) using a bonding structure that comprises an adhesive layer and a thin metallic layer (step 10). In one embodiment of the invention, the handler wafer is a Si handler wafer (or substrate) which is bonded to a Si device wafer, as the use of a mechanical Si handler wafer enables compatibility with standard CMOS silicon wafer processing technologies. In other embodiments of the invention, the handler wafer can be formed of other suitable materials that are transparent or semi-transparent (e.g., 50% transparent) to certain wavelength in the infrared (IR) spectrums that are used for IR laser ablation.

Moreover, bonding structures according to embodiments of the invention utilize one or more adhesive layers and thin metallic layers that serve as releasable layers that are ablated using IR radiation to debond the device and handler wafers. In particular, in one embodiment, a bonding structure comprises one or more thin metallic layers that are configured to strongly absorb IR energy emitted from a pulsed IR laser and improve the ablation efficiency, and reduce an ablation energy threshold for bonding structures. Indeed, with these bonding structures, an ultra-short pulse of IR energy from the IR laser can be readily absorbed by the thin metallic layers (constrained in a very shallow depth within the bonding structure) to thereby quickly and efficiently vaporize at least a portion of the thin metallic layer and at least a portion of the adhesive layer at an interface between the adhesive layer and the thin metallic layer, and release the device wafer from the handler wafer. Various bonding structures according to alternative embodiments of the invention will be described in further detail below with reference to FIGS. 2-9.

Referring again to FIG. 1, once the wafer bonding process is complete, standard wafer processing steps can be performed with the handler wafer attached to the device wafer (step 11). For instance, in one embodiment of the invention, the handler wafer is bonded to a BEOL (back-end-of-line) structure formed on an active surface of the device wafer. In this instance, standard wafer processing steps such as grinding/polishing the backside (inactive) surface of the device wafer to thin the device wafer can be performed. Other wafer processing steps include forming through-silicon-vias through the backside of the device wafer to the integrated circuits formed on the active side of the device wafer. In other embodiments, the device wafer may be subject to a wafer dicing process with the handler wafer attached such that an individual die, or multiple dies, can be held by the temporary handler wafer for die assembly or other processes where the dies are assembled to a substrate or another full thickness die, and then released in subsequent operations such as post assembly or post underfill. During these processing steps, the handler wafer will impart some structural strength and stability to the device wafer, as is readily understood by those of ordinary skill in the art.

A next step in the illustrative process of FIG. 1 involves performing a laser ablation wafer debonding process to release the device wafer from the handler wafer (step 12). In one embodiment, this process involves irradiating the bonding structure through the handler wafer using long-wavelength IR energy to laser ablate the bonding structure and release the device wafer. More specifically, in one embodiment, the process involves directing a pulsed IR laser beam at the handler wafer, and scanning the pulsed IR laser beam across at least a portion of the stack structure to laser ablate at least a portion of the bonding structure. As noted above, ablation of the bonding structure comprise vaporizing at least a portion of the thin metallic layer and/or vaporizing at least a portion of the thin metallic layer and adhesive layer at an interface between the adhesive layer and the thin metallic layer, which enables release of the device wafer from the handler wafer. Various embodiments of an IR laser ablation process will be described in further detail below with reference to FIGS. 2-10.

Once the IR laser ablation process is complete and the device wafer is released from the handler wafer, a post debonding cleaning process can be performed to remove any remaining adhesive material or other residue (resulting from the ablation of the bonding structure) from the device wafer (step 13). For example, cleaning process can be implemented using a chemical cleaning process to remove any polymer based adhesive material, or other known cleaning methods to remove residue of the ablated bonding structure.

Figure 2:
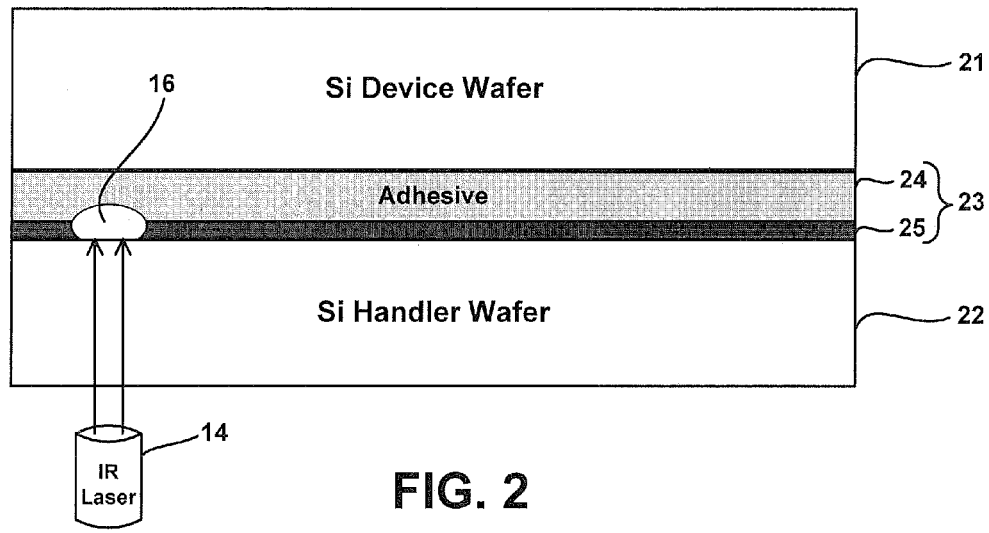
FIG. 2 schematically depicts a stack structure comprising a bonding structure for temporarily bonding a device wafer to a handler wafer, according to an embodiment of the invention.

FIG. 2 schematically depicts a stack structure comprising a bonding structure for temporarily bonding a device wafer to a handler wafer, according to an embodiment of the invention. More specifically, FIG. 2 is a schematic side view of a stack structure 20 comprising a silicon device wafer 21, a silicon handler wafer 22, and a bonding structure 23. The bonding structure 23 comprises an adhesive layer 24 and a thin metallic layer 25. FIG. 2 further illustrates an IR laser 14 that emits an IR laser beam at the handler wafer 22 to irradiate a portion of the bonding structure 23 resulting in a laser-ablated region 16.

In one embodiment of the invention, IR laser 14 emits a pulsed infrared laser beam to laser ablate the bonding structure 23, wherein the IR laser 14 emits a long wavelength infrared laser beam with an output wavelength that is greater than about 5 μm. In one alternative embodiment, the IR laser 14 is a far infrared (FIR) laser having an output wavelength in a far IR portion of the electromagnetic spectrum between about 5 μm and 30 μm. The silicon handler wafer 22 is approximately 50% transparent at these frequencies so that the laser beam will penetrate the handler wafer 22 and irradiate the bonding structure 23.

In one embodiment, the adhesive layer 24 may be formed of any suitable polymer adhesive material that may or may not be capable of sufficiently absorbing the IR energy output from the IR laser 14. Irrespective of the IR absorption ability of the adhesive layer 24, in one embodiment of the invention, the thin metallic layer 25 is configured (in material composition and thickness) to intensely absorb the IR energy and serve as a primary releasable layer of the bonding structure 23, which is ablated by the IR laser energy. The thin metallic layer 25 improves the laser ablation efficiency and thus, reduces the ablation threshold of the bonding structure 23 (as compared to a bonding structure that uses an adhesive layer alone). In one embodiment of the invention, the bonding structure 23 is irradiated with infrared energy sufficient to fully vaporize (ablate) at least a portion of the thin metallic layer 25 that is exposed to the IR energy.

Moreover, in an alternate embodiment of the invention, the bonding structure 23 is irradiated with infrared energy sufficient to fully vaporize (ablate) at least a portion of the thin metallic layer 25 that is exposed to the IR energy, as well as vaporize, denature, carbonize, or otherwise ablate and at least a portion of the adhesive layer 24 at an interface between the adhesive layer 24 and the portion of the thin metallic layer 25 that is irradiated and ablated. In other words, in the bonding structure 23 shown in FIG. 2, the portion of the thin metallic layer 25 that is irradiated by the IR laser 14 is heated and vaporized, and this heating and ablation of the thin metallic layer 25 results in heating of the surrounding material of the adhesive layer 24 (at the interface between the irradiated thin metallic layer 25 and adhesive layer 24), which causes ablation of the adhesive layer. In addition, depending on the IR absorption properties of the material used to form the adhesive layer 24, ablation of the adhesive layer 24 is further achieved by any additional heating that is due to absorption of the IR energy by the adhesive layer 24.

In one embodiment of the invention, the thin metallic layer 25 is formed of a metallic material having properties such as being reactive (not inert), soft, and having a relatively low melting point. For example, the thin metallic layer 25 may be formed of materials such as aluminum (Al), tin (Sn) or zinc (Zn). Moreover, in one embodiment of the invention, the thin metallic layer 25 is formed with a thickness in a range of about 5 nanometers to about 100 nanometers. The thin metallic layer 25 is formed on the handler wafer 22 using one of various standard techniques such as chemical vapor deposition (CVD), physical vapor deposition (PVD), or atomic layer deposition (ALD). The ablation threshold of IR laser irradiation (level of exposure and time of exposure) will vary depending on the thickness and type of metallic material used to form the thin metallic layer 25. In all instances, the thin metallic layer 25 is configured to substantially absorb (and not reflect) the IR laser energy, so that ablation of the thin metallic layer 25 occurs.

The adhesive layer 24 can be formed using known materials and deposition techniques. For instance, the adhesive layer 24 can be formed of any suitable polymeric adhesive material, and the adhesive material can be spin-coated either on the thin metal layer 25, or on a surface of the Si device wafer 21. Thereafter, a standard bonding process is implemented to bond the device and handler wafers 21 and 22.

Figure 3:
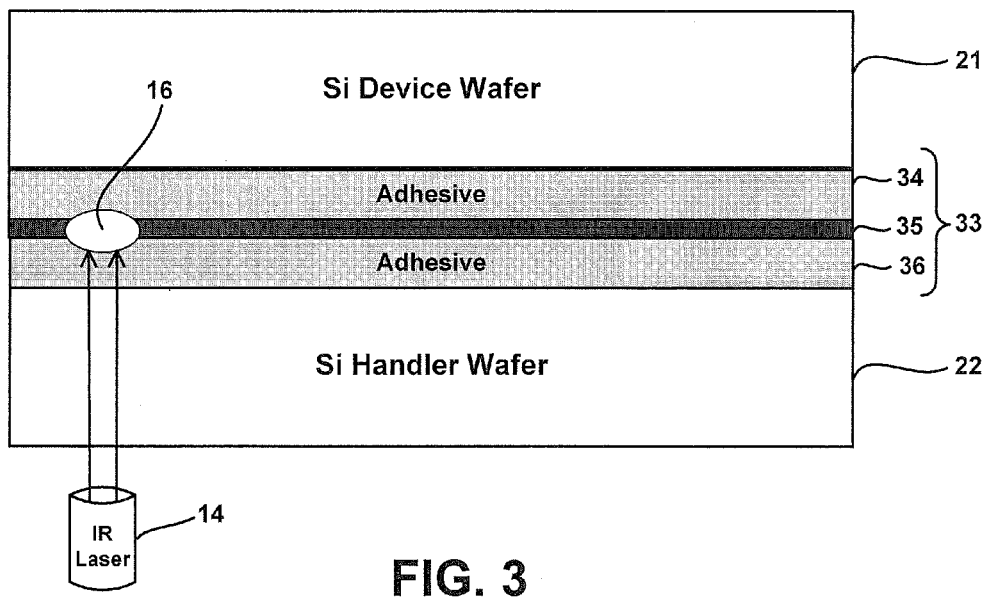
FIG. 3 schematically depicts a stack structure comprising a bonding structure for temporarily bonding a device wafer to a handler wafer, according to another embodiment of the invention.

FIG. 3 schematically depicts a stack structure comprising a bonding structure for temporarily bonding a device wafer to a handler wafer, according to another embodiment of the invention. In particular, FIG. 3 is a schematic side view of a stack structure 30 which is similar to the stack structure 20 of FIG. 2, except that a bonding structure 33 shown in FIG. 3 comprises a first adhesive layer 34, a second adhesive layer 36, and a thin metallic layer 35 disposed between the first and second adhesive layers 34, 36. In the embodiment of FIG. 3, the bonding structure 33 further reduces an ablation threshold by having two metal-adhesive material interfaces which increases the IR absorption and heating of the bonding structure 33 and, thus, increases the efficiency of the ablation process.

The first and second adhesive layers 34 and 36, and the thin metallic layer 35 may be formed of the same or similar materials as discussed above with reference to FIG. 2. In the embodiment of FIG. 3, the second adhesive layer 36 can be spin-coated onto the surface of the handler wafer 22 and then cured using a known curing process. The curing process results in formation of a polymer passivation layer upon which the thin metallic film 35 may be deposited using metallic materials and methods as discussed above. The first adhesive layer 34 can be spin-coated onto the thin metal layer 35 or onto the surface of the device wafer 21. Thereafter, the device and handler wafers 21 and 22 are bonded together using known bonding techniques.

Figure 4:
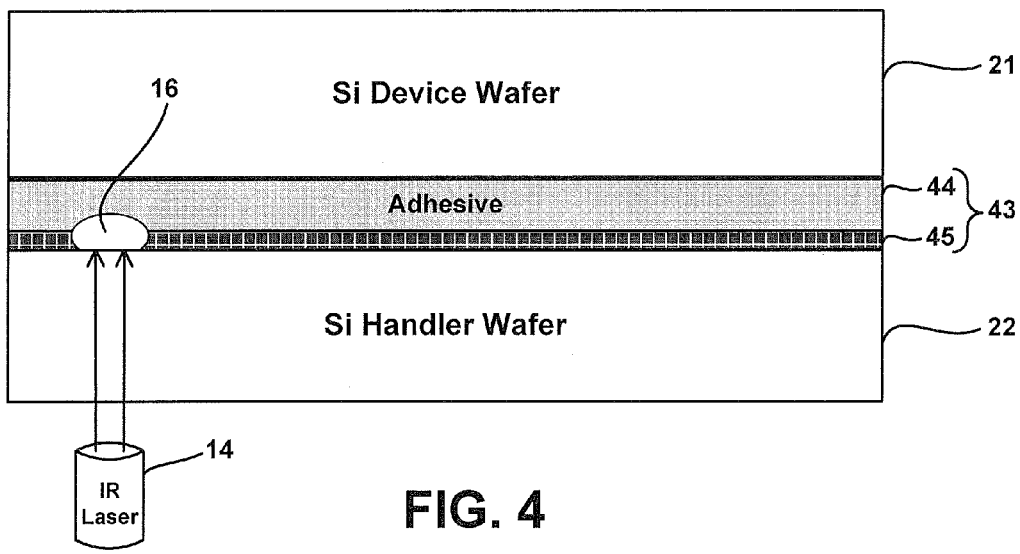
FIG. 4 schematically depicts a stack structure comprising a bonding structure for temporarily bonding a device wafer to a handler wafer, according to another embodiment of the invention.

FIG. 4 schematically depicts a stack structure comprising a bonding structure for temporarily bonding a device wafer to a handler wafer, according to another embodiment of the invention. In particular, FIG. 4 is a schematic side view of a stack structure 40 which is similar to the stack structure 20 of FIG. 2, except that a bonding structure 43 shown in FIG. 4 comprises an adhesive layer 44 in contact with a thin metallic layer 45 having a roughed, non-planar surface (as depicted illustratively, by the cross-hatching of the layer 45). The adhesive layer 44 and the thin metallic layer 45 may be formed of the same or similar materials as discussed above with reference to FIG. 2.

In the embodiment of FIG. 4, the roughed surface topography of the thin metallic layer 45 serves to increase the contact area of the interface between the adhesive layer 44 and the thin metallic layer 45. The increased contact area reduces the ablation threshold by enabling more heat transfer from the thin metal layer 45 to the surrounding material of the adhesive layer 44 as the thin metallic layer 45 is heated and ablated by IR irradiation. In one embodiment of the invention, the thin metallic layer 45 with a rough surface topography can be formed by first etching (dry etch or wet etch) the surface of the handler wafer 22 to roughen the silicon surface of the handler wafer 22. A metallic material is then conformally deposited on the roughened surface of the Si wafer handler 22 (using suitable metallic materials and deposition methods as discussed above). This deposition process naturally forms a rough-surface thin metallic material 45 as the deposition of the metallic material conformally follows the topography of the roughened surface of the handler wafer 22.

Figure 5:
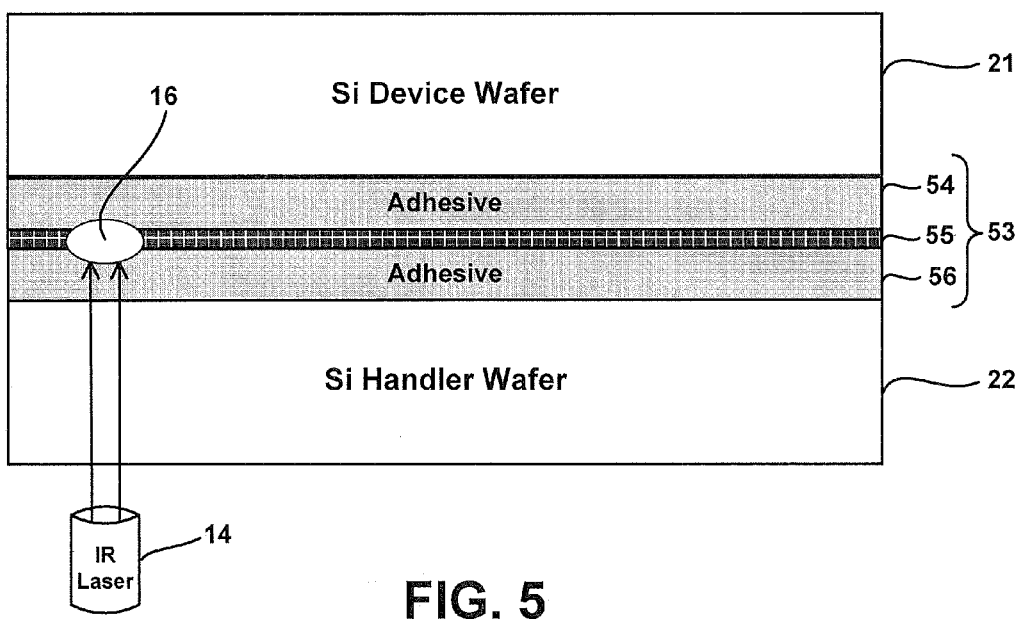
FIG. 5 schematically depicts a stack structure comprising a bonding structure for temporarily bonding a device wafer to a handler wafer, according to another embodiment of the invention.

FIG. 5 schematically depicts a stack structure comprising a bonding structure for temporarily bonding a device wafer to a handler wafer, according to another embodiment of the invention. In particular, FIG. 5 is a schematic side view of a stack structure 50 which is similar to the stack structure 30 of FIG. 3, except that a bonding structure 53 shown in FIG. 5 comprises a rough surface thin metallic layer 55 disposed between a first adhesive layer 54 and a second adhesive layer 56. The adhesive layers 54, 56 and the roughened surface thin metallic layer 55 can be formed of the same or similar materials as discussed above. In the embodiment of FIG. 5, the roughened surface of the thin metallic layer 55 serves to increase the contact area of the interface between the first adhesive layer 54 and the thin metallic layer 55, as well as increase the contact area of the interface between the second adhesive layer 56 and the thin metallic layer 55. This bonding structure 53 further reduces the ablation threshold by enabling more heat transfer from the thin metal layer 55 to the surrounding materials of the first and second adhesive layers 54, 56, thereby enhancing the ablation efficiency of the irradiated materials in the laser-ablated region 16.

The stack structure 50 of FIG. 5 can be fabricated by spin coating a polymeric adhesive material onto the handler wafer 22, followed by an adhesive cure process to form the second adhesive layer 56. The second adhesive layer 56 is then etched using a dry etch process (e.g., plasma etch) to roughen the surface topography of the adhesive layer 56. A metallic material is then conformally deposited on the roughened surface of the first adhesive layer 56 (using suitable metallic materials and deposition methods as discussed above). This deposition process naturally forms a rough-surface thin metallic material 55 as the deposition of the metallic material conformally follows the topography of the roughened surface of the etched adhesive layer 56. The first adhesive layer 54 can be spin-coated onto the thin metallic layer 55 or onto the surface of the device wafer 21 using known techniques, followed by a bonding process to bond the device and handler wafers 21 and 22 together.

Figure 6:
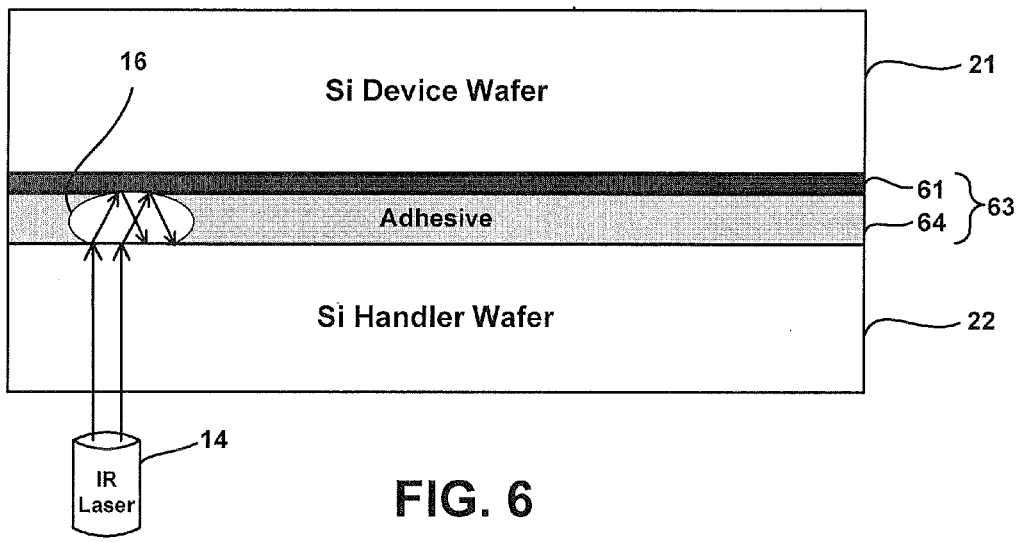
FIG. 6 schematically depicts a stack structure comprising a bonding structure for temporarily bonding a device wafer to a handler wafer, according to another embodiment of the invention.

FIG. 6 schematically depicts a stack structure comprising a bonding structure for temporarily bonding a device wafer to a handler wafer, according to another embodiment of the invention. More specifically, FIG. 6 is a schematic side view of a stack structure 60 comprising a silicon device wafer 21, a silicon handler wafer 22, and a bonding structure 63. The bonding structure 63 comprises a protective metal layer 61 and an adhesive layer 64. In the embodiment of FIG. 6, the protective metal layer 61 is disposed between the adhesive layer 64 (of the bonding structure 63) and the device wafer 21 to protect the device wafer 21 from being irradiated with the infrared energy emitted from the IR laser 14 during a laser ablation process.

In the embodiment of FIG. 6, the protective metal layer 61 is configured (in material composition and thickness) to reflect incident IR laser energy away from the device layer 21 back into the adhesive layer 64. In this embodiment, although a thin metallic layer is not used in the bonding structure 63 as a primary releasable layer for IR laser ablation, the reflection of the IR laser energy from the protective metal layer 61 back into the adhesive layer 64 increases the IR absorption (and thus heat generation) in the irradiated portion of the adhesive layer 64, which enhances the ablation efficiency of the irradiated adhesive material in the laser-ablated region 16. The protective metallic layer 61 may be formed using an inert metallic material such as titanium, gold or copper, with a thickness that is sufficient to reflect the IR energy (thicker than a skin depth of the protective metal layer 61 at the given IR laser wavelength).

Figure 7:
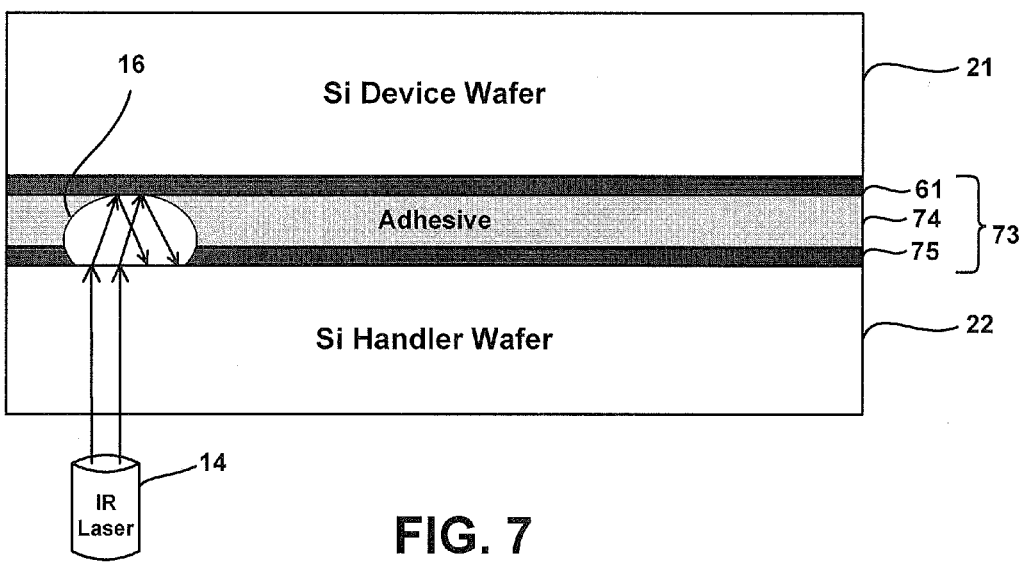
FIG. 7 schematically depicts a stack structure comprising a bonding structure for temporarily bonding a device wafer to a handler wafer, according to another embodiment of the invention.

FIG. 7 schematically depicts a stack structure comprising a bonding structure for temporarily bonding a device wafer to a handler wafer, according to another embodiment of the invention. More specifically, FIG. 7 is a schematic side view of a stack structure 70 which is similar to the stack structures 20 (of FIG. 2) and 60 (of FIG. 6) wherein a bonding structure 73 shown in FIG. 7 comprises a combination of a protective metal layer 61, an adhesive layer 74 and a thin metallic layer 75 that serves as the primary releasable layer for IR laser ablation. The adhesive layer 74 and the thin metallic layer 75 may be formed of the same or similar materials as discussed above with reference to FIG. 2, and the protective metal layer 61 may be formed of the same materials discussed above with reference to FIG. 6. In the embodiment of FIG. 7, the ablation efficiency of the irradiated adhesive material and metallic layer 75 in the laser-ablated region 16 is further enhanced by the additional IR irradiation reflected back from the protective metal layer 61.

Figure 8:
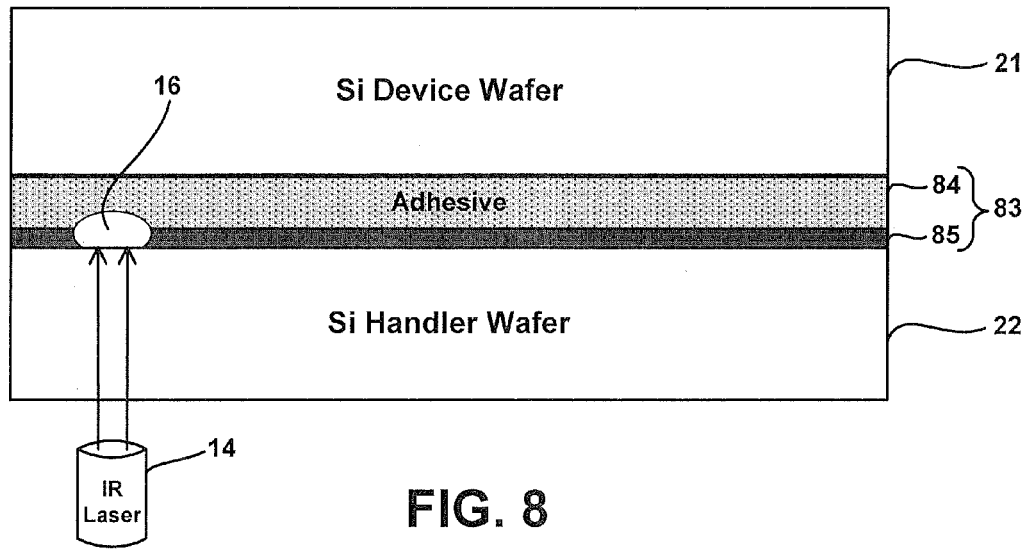
FIG. 8 schematically depicts a stack structure comprising a bonding structure for temporarily bonding a device wafer to a handler wafer, according to another embodiment of the invention.

FIG. 8 schematically depicts a stack structure comprising a bonding structure for temporarily bonding a device wafer to a handler wafer, according to another embodiment of the invention. In particular, FIG. 8 is a schematic side view of a stack structure 80 which is similar to the stack structure 20 of FIG. 2, except that a bonding structure 83 shown in FIG. 8 comprises an adhesive layer 84, and a thin metallic layer 85, wherein the adhesive layer 84 comprises infrared energy absorbing nanoparticles (schematically illustrated by the dotted fill of layer 84). The IR energy absorbing nanoparticles enhances the IR energy absorption of the adhesive layer 84 and, thus, reduces the overall ablation threshold of the bonding structure 83.

In one embodiment of the invention, the adhesive layer 84 is formed of a polymer adhesive material that is premixed with metallic nanoparticles that improve the IR absorption of the adhesive material. For example, the nanoparticles may be formed of Sn, Zn, Al, carbon nanotubes or graphene, or a combination thereof. The adhesive layer 84 may be formed by spin coating the polymer adhesive material with the premixed with metallic nanoparticles onto the surface of the thin metallic layer 85 or onto the surface of the device wafer 21.

Figure 9:
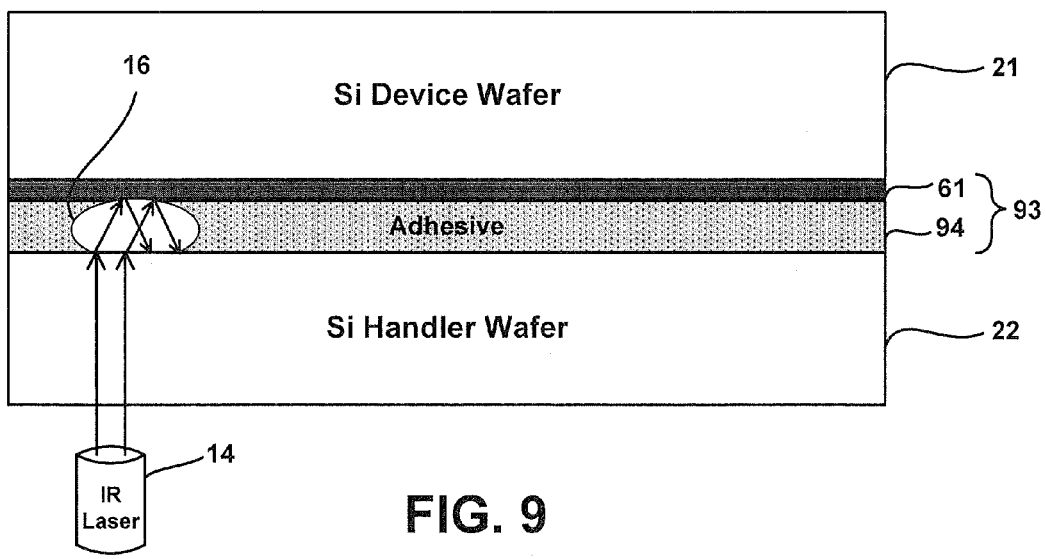
FIG. 9 schematically depicts a stack structure comprising a bonding structure for temporarily bonding a device wafer to a handler wafer, according to another embodiment of the invention.

FIG. 9 schematically depicts a stack structure comprising a bonding structure for temporarily bonding a device wafer to a handler wafer, according to another embodiment of the invention. In particular, FIG. 9 is a schematic side view of a stack structure 90 which is similar to the stack structure 60 of FIG. 6, except that a bonding structure 93 shown in FIG. 9 comprises an adhesive layer 94 which comprises infrared energy absorbing nanoparticles (schematically illustrated by the dotted fill of layer 94), to enhance IR energy absorption of the adhesive layer 94 and reduce the ablation threshold of the bonding structure 93. The reflection of the IR laser energy from the protective metal layer 61 back into the nanoparticle adhesive layer 94 further increases the IR absorption and heat generation in the irradiated portion of the nanoparticle adhesive layer 94 to thereby even further enhance the ablation efficiency of the irradiated material in the laser-ablated region 16 of the bonding structure 93. The protective metal layer 61 and nanoparticle adhesive layer 94 may be formed of the same or similar materials discussed above.

In other embodiments of the invention, a bonding structure may include a nanoparticle adhesive layer alone, with no laser-ablated thin metallic layer or protective metal layer. In particular, a stack structure can be formed by bonding a silicon device wafer and a silicon handler wafer together with an adhesive layer having infrared energy absorbing nanoparticles, wherein the adhesive layer serves as a releasable layer by infrared ablation of the adhesive layer. In other alternative embodiments, the adhesive layers shown in FIGS. 3, 4, 5, and 7 can be formed with nanoparticle adhesive layers.

Figure 10A:
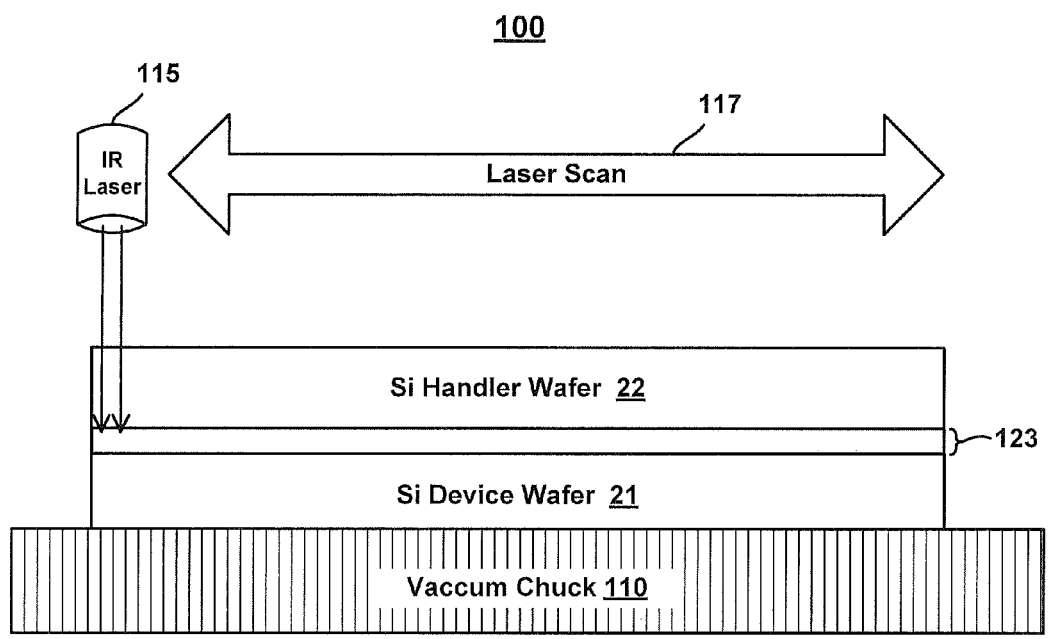
FIGS. 10A, 10B and 10C schematically depict an apparatus to perform a debonding process to separate a device wafer and handler wafer, according to an embodiment of the invention.
Figure 10B:
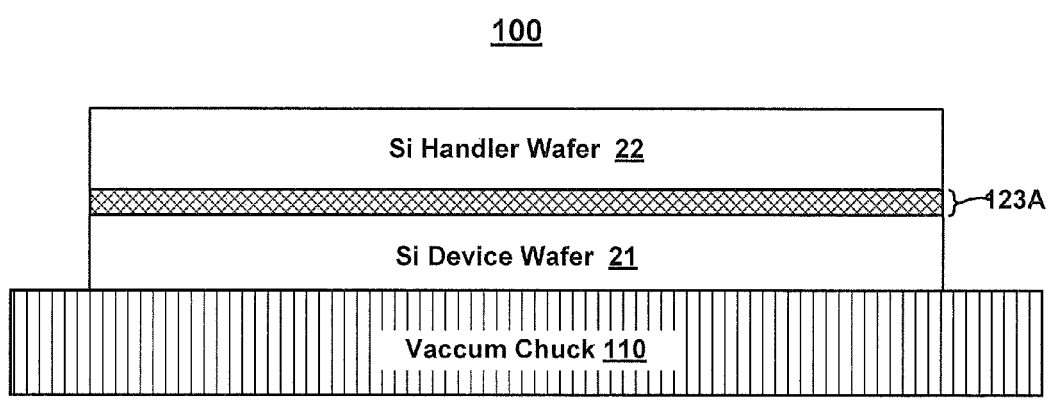
Figure 10C:
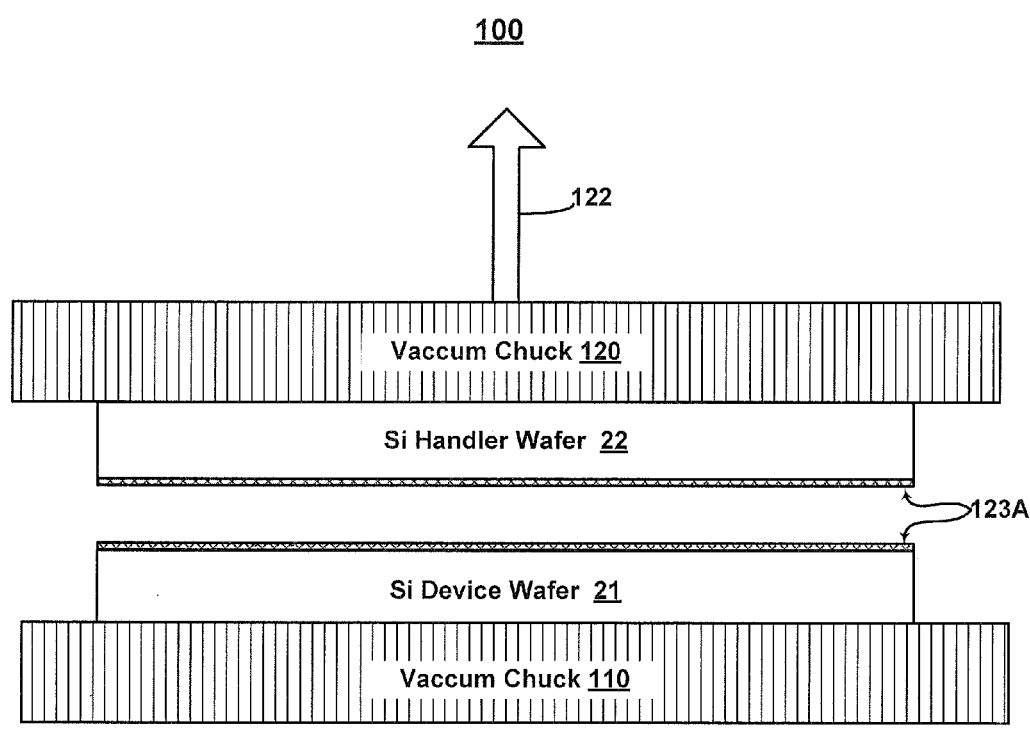

FIGS. 10A, 10B and 10C schematically depict an apparatus to perform a debonding process to separate a device wafer and handler wafer, according to an embodiment of the invention. In particular, FIGS. 10A, 10B and 10C schematically illustrate an apparatus 100 for processing a stack structure comprising a device wafer 21, a handler wafer 22, and a bonding structure 123 disposed between the device wafer 21 and the handler wafer 22. The bonding structure 123 may be any one of the bonding structure depicted in FIG. 2, 3, 4, 5, 6, 7, 8 or 9, for example. The apparatus 100 comprises a vacuum system comprising a first vacuum chuck 110 and a second vacuum chuck 120, as well as an infrared laser scan system 115, 117. The vacuum system applies a vacuum suction force through the first vacuum chuck 110 to hold the stack structure 21/123/22 in place with the device wafer 21 in contact with the first vacuum chuck 110.

The infrared laser scan system 115, 117 applies a pulsed infrared laser 115 at the backside of the handler wafer 22 to irradiate the bonding structure 123 with infrared energy and ablate the bonding structure 123 to release the handler wafer from the device wafer. A scan system 117 is used to scan the IR laser 115 back and forth across the stack structure 22/123/21, wherein the infrared laser scan system 115, 117 controls the laser ablation scan process by controlling the power (energy density beam), the scan speed, and the pulse rate, for example, in a manner that is sufficient to effectively ablate the bonding structure 123, or a portion of the bonding structure 123 at desired target regions of the stack structure. The parameters of the IR laser scan can vary depending on the bonding structure framework.

FIG. 10B illustrates a state of the apparatus 100 in which the IR laser scan is complete and the entire bonding structure is sufficiently ablated to release the handler wafer 22 from the device wafer 21. In particular, FIG. 10B schematically illustrates a state in which a completely ablated bonding structure 123A exists between the handler wafer 22 and the device wafer 21 (as schematically illustrated by cross-hatching of the layer 123A shown in FIG. 10B). In other embodiments of the invention, the IR laser scan process can be controlled such as certain regions of the bonding structure are laser ablated (e.g., diced die regions), while other regions of the bonding structure are not.

After IR laser ablation of the bonding structure 123, referring to FIG. 10C, the vacuum system places the second vacuum chuck 120 in contact with the handler wafer 22, and applies a vacuum suction force through the second vacuum chuck 120, and the second vacuum chuck 120 is lifted up with a lifting device 122 to pull the handler wafer 22 from the device wafer 21.

Thereafter, the device wafer 21 can be transferred to a chemical station to etch or otherwise remove the residual temporary adhesive layer 123A that remains on the surface of the device wafer 21 after the debonding process shown in FIG. 10C. Although not shown in FIGS. 10A, 10B and 10C, the apparatus 100 may further comprise an air handler, filtration/condensation system or exhaust system to remove and trap debris and exhaust excess gases that are generated during the debonding process. It is to be understood that FIGS. 10A, 10B and 10C generically illustrate a high-level structural depiction of a standard wafer-processing machine that can be implemented or retrofitted for IR laser ablation and wafer debonding, as discussed herein.

Although embodiments have been described herein with reference to the accompanying drawings for purposes of illustration, it is to be understood that the present invention is not limited to those precise embodiments, and that various other changes and modifications may be affected herein by one skilled in the art without departing from the scope of the invention.

We claim:

1. A method for handling a device wafer, comprising:
depositing a film of metal material directly on a silicon handler wafer to form a metal layer on the silicon handler wafer, wherein the metal layer serves as releasable layer and has a thickness in a range of 5 nanometers to less than 100 nanometers;
forming a polymer adhesive layer on the metal layer or on a surface of a device wafer;
bonding the device wafer to the silicon handler wafer using the polymer adhesive layer, wherein the device wafer and the silicon handler wafer are separate wafers;
processing the device wafer while bonded to the silicon handler wafer; and
debonding the device wafer and the silicon handler wafer by irradiating the metal layer with infrared energy through the silicon handler wafer to substantially or completely vaporize the metal layer such that the device wafer is physically released from the silicon handler wafer as a direct result of the substantial or complete vaporization of the metal layer, wherein a wavelength of the infrared energy is in a range of 5 μm to 30 μm.

2. The method of claim 1, wherein irradiating the metal layer comprises:
directing a pulsed infrared laser beam at the silicon handler wafer; and
scanning the pulsed infrared laser beam across at least a portion of the silicon handler wafer to substantially or completely vaporize the metal layer.

3. The method of claim 1, wherein the polymer adhesive layer further serves as a releasable layer, and wherein irradiating the metal layer with infrared energy further comprises vaporizing at least a portion of the polymer adhesive layer at an interlace between the polymer adhesive layer and the metal layer.

4. The method of claim 1, wherein the metal layer is formed of at least one of Al, Sn, and Zn.

5. The method of claim 1, further comprising forming a protective metal layer between the polymer adhesive layer and the device wafer to reflect the infrared energy away from the device wafer and protect the device wafer from being irradiated with the infrared energy.

6. The method of claim 1, wherein the polymer adhesive layer comprises a polymer material having infrared energy absorbing nanoparticles, wherein irradiating the metal layer with infrared energy through the silicon handler wafer further comprises vaporizing the infrared energy absorbing nanoparticles such that the polymer adhesive layer further serves as a releasable layer by vaporization of the infrared, energy absorbing nanoparticles.

7. The method of claim 6, wherein the nanoparticles include at least one Sn, Zn, Al, carbon nanotubes and graphene nanoparticles.

8. A method for handling a device wafer, comprising:
forming a polymer adhesive layer on a silicon handler wafer, wherein the polymer adhesive layer serves as releasable layer and comprises infrared energy absorbing nanoparticles that are vaporizable by infrared ablation;
bonding a device wafer to the silicon handler wafer using the polymer adhesive layer, wherein the device wafer and the silicon handler water are separate waters;
processing the device wafer while bonded to the silicon handler wafer; and
debonding the device wafer and the silicon handler wafer by irradiating the releasable layer with infrared energy through the silicon handler water to substantially or completely vaporize the infrared energy absorbing nanoparticles such that the device water is physically released from the silicon handler wafer as a direct result of the substantial or complete vaporization of the infrared energy absorbing nanoparticles within the polymer material, wherein a wavelength of the infrared energy is in a range of 5 μm to 30 μm.

9. The method of claim 8, wherein the nanoparticles are formed of at least one of Sn, Zn, Al, carbon nanotubes and graphene.

10. The method of claim 8, further comprising forming a protective metallic layer between the polymer adhesive layer and the device wafer to reflect the infrared energy away from the device wafer and protect the device wafer from being irradiated with the infrared energy.

11. The method of claim 1, wherein forming the metallic layer on the silicon handler water comprises forming a second polymer adhesive layer on a surface of the silicon handler wafer and depositing the metallic layer on the second polymer adhesive layer.

* * * * *